US010401911B2

United States Patent
Wu et al.

(10) Patent No.: US 10,401,911 B2
(45) Date of Patent: Sep. 3, 2019

(54) CERAMIC HOUSING

(71) Applicant: HEWLETT-PACKARD DEVELOPMENT COMPANY, L.P., Houston, TX (US)

(72) Inventors: Kuan-Ting Wu, Taipei (TW); Chi Hao Chang, Taipei (TW); Cheng-Feng Liao, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 12 days.

(21) Appl. No.: 15/516,456

(22) PCT Filed: Nov. 6, 2014

(86) PCT No.: PCT/US2014/064283
§ 371 (c)(1),
(2) Date: Apr. 3, 2017

(87) PCT Pub. No.: WO2016/072990
PCT Pub. Date: May 12, 2016

(65) Prior Publication Data
US 2018/0232012 A1    Aug. 16, 2018

(51) Int. Cl.
| | | |
|---|---|---|
| *B32B 3/02* | (2006.01) |
| *G06F 1/16* | (2006.01) |
| *B29C 45/14* | (2006.01) |
| *C04B 41/48* | (2006.01) |
| *C04B 41/83* | (2006.01) |
| *C23C 14/22* | (2006.01) |
| *C23C 16/44* | (2006.01) |
| *H05K 5/02* | (2006.01) |

(Continued)

(52) U.S. Cl.
CPC ...... *G06F 1/1656* (2013.01); *B29C 45/14336* (2013.01); *C04B 41/48* (2013.01); *C04B 41/83* (2013.01); *C23C 14/22* (2013.01); *C23C 16/44* (2013.01); *H05K 5/02* (2013.01); *B29K 2709/02* (2013.01); *B29L 2031/712* (2013.01); *G06F 1/1616* (2013.01)

(58) Field of Classification Search
CPC . G06F 1/1656; B29C 45/14336; C23C 14/22; C23C 16/44; H05K 5/02
See application file for complete search history.

(56) References Cited

U.S. PATENT DOCUMENTS 6,262,886 B1    7/2001    Difonzo et al.
8,655,422 B2    2/2014    Stiehl et al.
(Continued)

FOREIGN PATENT DOCUMENTS

KR    10-2010-0089484 A    8/2010
WO    WO-8100654 B1    3/1981
(Continued)

OTHER PUBLICATIONS

Jerry Tsai, "Zytel® HTN for Electronic Devices," 2014, pp. 1-3, DuPont.

*Primary Examiner* — Elizabeth E Mulvaney
(74) *Attorney, Agent, or Firm* — HPI Patent Department

(57) ABSTRACT

According to one example, a ceramic housing for an electronic device includes a surface and an elastomer, where the elastomer covers from ten percent to eighty-five percent of a total surface area of the surface.

27 Claims, 3 Drawing Sheets

(51) Int. Cl.
 *B29K 709/02* (2006.01)
 *B29L 31/00* (2006.01)

(56) References Cited

U.S. PATENT DOCUMENTS

| | | | |
|---|---|---|---|
| 9,011,997 B2 * | 4/2015 | Weber | B32B 37/144 |
| | | | 428/336 |
| 2006/0260840 A1 | 11/2006 | Kim | |
| 2008/0227504 A1 | 9/2008 | Chan | |
| 2009/0281251 A1 | 11/2009 | Bae et al. | |

FOREIGN PATENT DOCUMENTS

| | | |
|---|---|---|
| WO | WO-00/11796 A1 | 3/2000 |
| WO | WO-2004/008722 A1 | 1/2004 |

\* cited by examiner

CERAMIC HOUSING

Examples of electronic devices include laptop computers, tablets, media players, and cellular telephones, among others. Electronic devices are becoming increasingly more sophisticated, powerful and user friendly. Various electronic devices can have differing characteristics.

DETAILED DESCRIPTION

Examples of the present disclosure provide ceramic housings for electronic devices, systems including ceramic housings and electronic devices, and methods for preparing the ceramic housings. Examples of electronic devices include laptop computers, tablets, media players, workstations, gaming devices, phablets, televisions, wearable computing devices, scientific instruments, desktops, thin clients, and cellular telephones, among others. A housing, which may be referred to as a case among other terms, may be utilized to house and/or protect a number of components of the electronic device.

While ceramics may be less likely to scratch than metal and/or plastic, ceramics are generally not utilized as housings for electronic devices because ceramics can be brittle. Because of this brittleness, ceramics can be prone to break more often than metal and/or plastic, upon dropping for instance.

As mentioned, examples of the present disclosure provide ceramic housings for electronic devices and methods for preparing the ceramic housings. The methods for preparing the ceramic housings disclosed herein can help to provide that the ceramic housings have desirable characteristics. For instance, the ceramic housings disclosed herein may have an improved resistance to breakage, as compared to ceramics that are not prepared by the methods disclosed herein. Further, the ceramic housings disclosed herein may have a desirable tactile characteristic, among other benefits.

Figure 1:
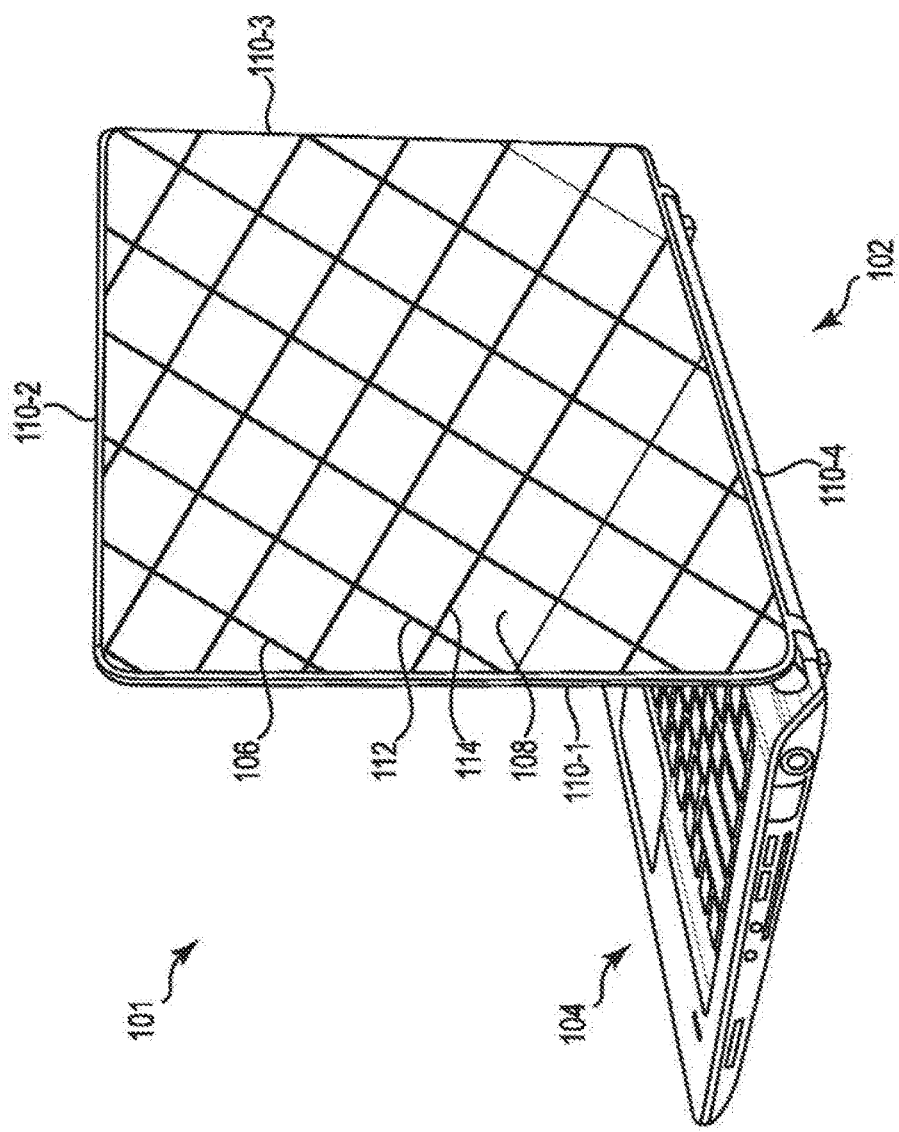
FIG. 1 illustrates a portion of a system in accordance with one or more examples of the present disclosure.

FIG. 1 illustrates a portion of system 101 in accordance with one or more examples of the present disclosure. The system 101 can include an electronic device 104 and a ceramic housing 102.

As illustrated in FIG. 1, the electronic device 104 can be a laptop computer. However, examples of the present disclosure are not so limited. For instance, some examples of the present disclosure provide that the electronic device can be a tablet, a media player, or a cellular telephone, among others.

"Ceramic" refers to inorganic compounds. Ceramics can be compounds having metallic and nonmetallic elements for which the interatomic bonds are ionic, or are predominantly ionic but can have some covalent character. Ceramics can be generally crystalline or partially crystalline. Examples of ceramics that may be utilized for examples of the present disclosure include, but are not limited to, alumina, zirconia, titanium carbide, silicon carbide, boron nitride, and porcelain. Examples of the present disclosure provide that different ceramics may be utilized for various applications.

For some applications, ceramics can be radio transparent. As such, electronic devices that include a ceramic housing as disclosed herein, may be able to send and/or receive wireless signals even when the electronic device has an antenna that is located internal relative to the ceramic housing.

The ceramic housing 102 can include an elastomer 106 adhered to a surface 108 of the ceramic housing 102. As mentioned, ceramics, e.g., the ceramic housing 102, can be brittle and thus ceramics can be prone to break more often than metal and/or plastic. Ceramic housings 102 having the elastomer 106 adhered to a surface 108 of the ceramic housing 102 may be less prone to break than ceramics not having an elastomer adhered thereto. For instance, the elastomer 106 adhered to the surface 108 of the ceramic housing 102 may absorb a portion of energy generated by dropping the electronic device 104 and the ceramic housing 102. In other words, the elastomer 106 may function as a shock absorber. Because the elastomer 106 adhered to the surface 108 of the ceramic housing 102 can absorb energy, the ceramic housing 102 may be less prone to break than ceramics not having an elastomer adhered thereto.

"Elastomer" refers to polymers that display rubber-like elasticity. Some examples of the present disclosure provide that the elastomer 106 is a thermoset. Thermosets are polymers having a high degree of cross-linked molecular chains, as compared to thermoplastics. However, examples of the present disclosure are not so limited. For instance, some examples of the present disclosure provide that the elastomer 106 is a thermoplastic. Thermoplastics are polymers having a high degree of linear molecular chains, as compared to thermosets. Examples of the elastomer 106 include, but are not limited to, polyisoprene, styrene-butadiene, polybutadiene, actonitlrie-butadiene, isobutylene-isoprene, ethylene-propylene monomer, ethylene-propylene-diene monomer, polychloroprene, thermoplastic urethane elastomers, styrenic block copolymers, copolyether ester elastomers, polyester amide elastomers, alkyl acrylate copolymer, chlorinated polyethylene, epichlorhydrin, fluoropolymer, hydrogenated nitrile, polysulphide, nitrile, polyurethane, silicone, tetrafluoroethylene propylene, and combinations thereof.

Examples of the present disclosure provide that different amounts of the elastomer 106 may be utilized for various applications. For instance, some examples of the present disclosure provide that the elastomer 106 can cover from ten percent to eighty-five percent of a total surface area of the surface 108 of the ceramic housing 102. In other words, the elastomer 106 can be directly adhered to ten percent to eighty-five percent of the total surface area of the surface 108 of the ceramic housing 102. Some examples of the present disclosure provide that the elastomer 106 can cover from fifteen percent to seventy-five percent, twenty to seventy percent, or twenty-five to sixty-five percent of a total surface area of the surface 108 of the ceramic housing 102.

Some examples of the present disclosure provide that the surface 108 is a planar surface. Some examples of the present disclosure provide that the surface 108 is an exterior surface, e.g., exterior relative to a number of components, such as a screen or processor, among others, of the electronic device 104. An exterior surface can correspond to a surface that is viewable when the ceramic housing 102 is in a closed position, e.g., when the electronic device 104 is a laptop computer. An exterior surface can also correspond to a surface that is designed to be touched by a user of the electronic device, e.g., a surface that is opposite to a touch screen of smart phone, for instance. Some examples of the present disclosure provide that the surface 108 is a major surface, e.g., in contrast to minor surfaces 110-1, 110-2, 110-3, and 110-4, which each abut against the surface 104.

Examples of the present disclosure provide that the elastomer 106 may have different median thicknesses for various applications. For instance, some examples of the present disclosure provide that the elastomer 106 can have a median thickness from 0.01 millimeters to 1.00 millimeter.

The elastomer 106 may cover the surface 108 in different arrangements for various applications. Examples of the present disclosure provide that the elastomer 106 may cover the surface 108 in a number of shapes formed of lines, curves, and/or combinations thereof. The lines, curves, or combinations thereof can be utilized to form various shapes. For instance, the elastomer 106 can form a portion, e.g., a part and/or a whole, of a polyhedron, an ellipse, a square, a circle, a triangle, and/or combinations thereof. Some examples of the present disclosure provide that the elastomer 106 may cover the surface 108 in a non-random arrangement such as a design or a pattern. Some examples of the present disclosure provide that the elastomer 106 may cover the surface 108 in a random arrangement. Additionally, some examples of the present disclosure provide that the elastomer 106 may cover the surface 108 in combination of a non-random arrangement and a random arrangement.

As an example and as illustrated in FIG. 1, the elastomer 106 can cover the surface 108 with a first set of lines that are parallel to line 112 and a second set of lines that are parallel to line 114, where line 112 is perpendicular to line 114. The first set of lines that are parallel to line 112 and the second set of lines that are parallel to line 114 have a non-random arrangement. In other words, first set of lines that are parallel to line 112 and the second set of lines that are parallel to line 114 form a pattern.

Figure 2:
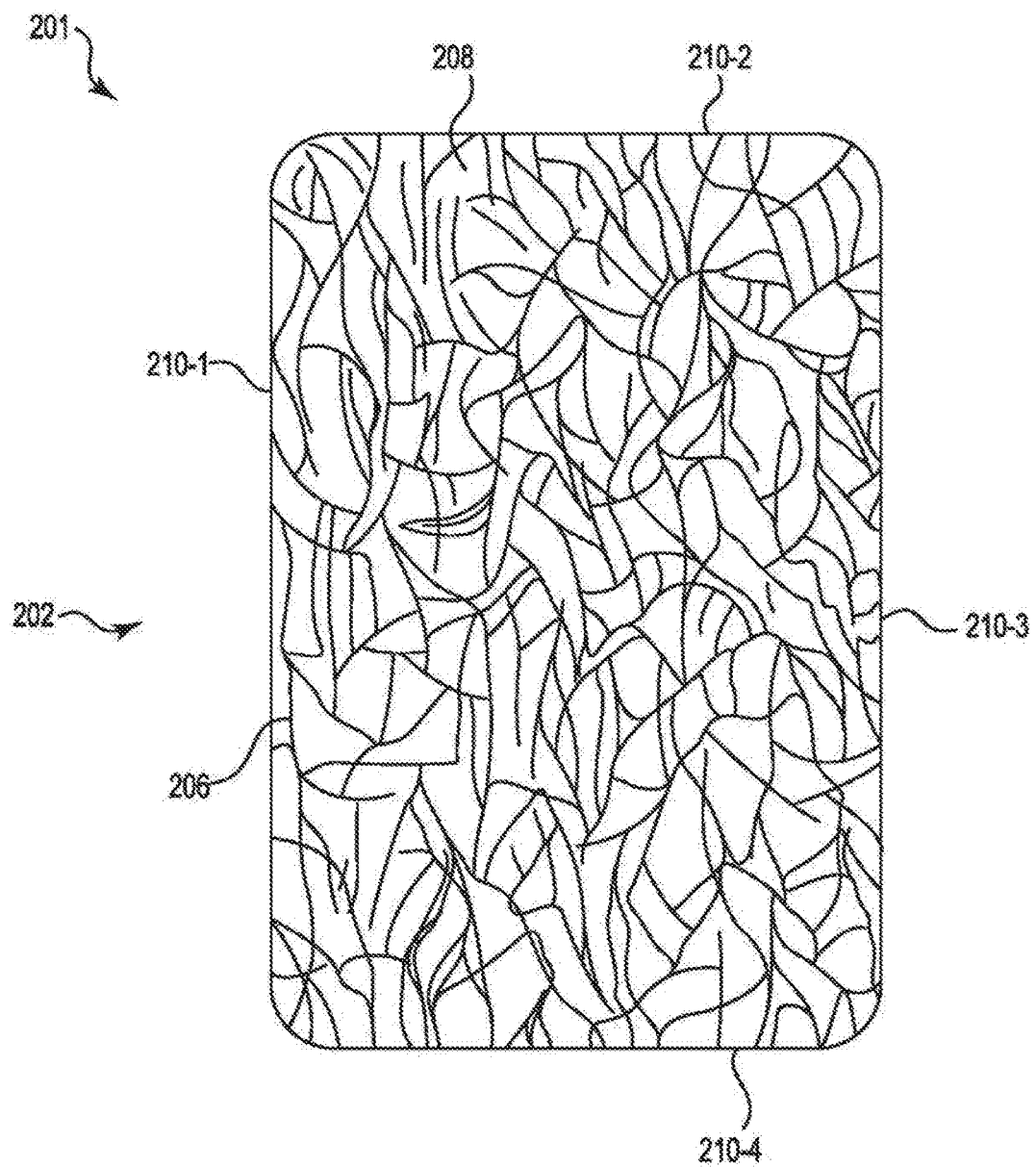
FIG. 2 illustrates a portion of a system in accordance with one or more examples of the present disclosure.

FIG. 2 illustrates a portion of a system 201 in accordance with one or more examples of the present disclosure. As mentioned, systems according to the present disclosure, e.g., system 201, can include a ceramic housing 202.

The ceramic housing 202 can include a major surface, e.g. surface 208, and minor surfaces 210-1, 210-2, 210-3, and 210-4, which each abut against the surface 204. As illustrated in FIG. 2, the surface 208 is opposite to a component of an electronic device, such as a touch screen of a smart phone, for instance.

FIG. 2 illustrates an elastomer 206 that can cover a portion, e.g., from ten percent to eighty-five percent of a total surface area, of the surface 208 of the ceramic housing 202. As illustrated in FIG. 2, the elastomer 206 may cover the surface 208 in a random arrangement.

Some examples of the present disclosure provide that a deposition layer may be formed on the surface, e.g. surface 108 and/or 208, of the ceramic housing. Some examples of the present disclosure provide that a layer, e.g., the deposition layer, is uniform on an exposed surface, such as portions of the surface 108 and/or 208 that are not covered by the elastomer. However, as used herein, a "layer" may be un-uniform on the exposed surface. Additionally, a "layer" may not occur on all portions of the exposed surface. Such a partial layer is understood to be a layer herein.

The deposition layer can include various metals. The metals include aluminum, magnesium, lithium, zinc, chromium, nickel, titanium, niobium, stainless steel, copper, and alloys thereof, for example. Examples of the present disclosure provide that the deposition layer can have a thickness from about 0.2 microns to about 300 microns. Some examples of the present disclosure provide that the deposition layer can have a thickness from about 0.5 microns to about 100 microns.

Some examples of the present disclosure provide that the deposition layer can be formed by a physical vapor deposition process. Examples of physical vapor deposition processes include ion-beam sputtering, reactive sputtering, ion-assisted deposition, high-target-utilization sputtering, high-power impulse magnetron sputtering, gas flow sputtering, and chemical vapor deposition, among others. Physical vapor deposition is a process where a number of deposition layers of a metal can be formed on the magnesium alloy substrate by contacting metal, as discussed herein, to be deposited with the magnesium alloy substrate. Different physical vapor deposition conditions may be utilized for various applications.

Some examples of the present disclosure provide that a functional coating layer can be formed on the surface of the ceramic housing. For instance, a functional coating layer can be formed on the surface of the ceramic housing subsequent to the deposition layer being formed on the surface of the ceramic housing. Examples of the functional coating layer include, but are not limited to, anti-finger print coatings, anti-bacterial coatings, anti-smudge coatings, protection coatings, insulation coatings, and soft touch coatings. The functional coating layer can be formed by various processes. The functional coating layer can have different thicknesses for various applications.

Figure 3:
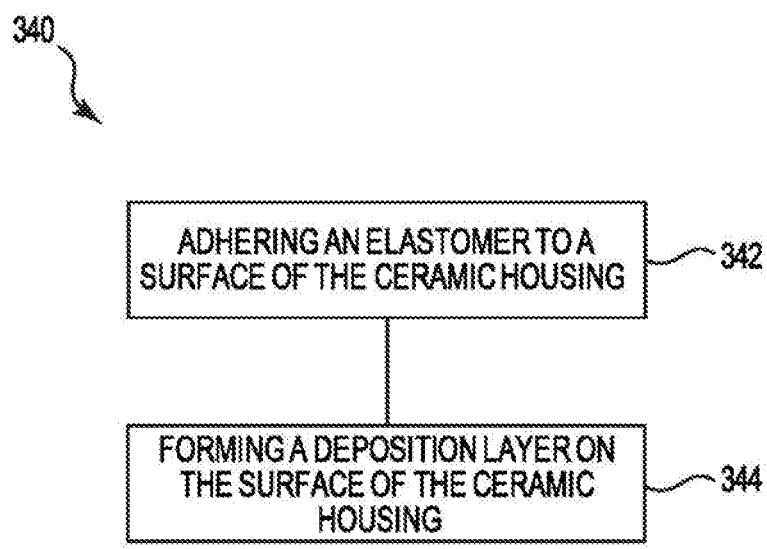
FIG. 3 illustrates a block diagram of an example of a method according to the present disclosure.

FIG. 3 illustrates a block diagram of an example of a method 340 according to the present disclosure. The method 340 may be utilized for forming a ceramic housing for an electronic device.

At 342, the method 342 can include adhering an elastomer to a surface of the ceramic housing. As discussed herein, the elastomer can cover from ten percent to eighty-five percent of a total surface area of the surface.

Examples of the present disclosure provide that the elastomer may be adhered to the surface of the ceramic housing by different processes for various applications. For instance, the elastomer may be adhered to the surface of the ceramic housing via an injection molding process.

Insert molding is an example of an injection molding process. Insert molding, a form of injection molding, can include inserting a ceramic housing into a mold and thereafter injecting an elastomer into the mold to adhere to a surface of the ceramic housing. However, examples of the present disclosure are not so limited. For instance, some examples of the present disclosure provide that the elastomer may be adhered to the surface of the ceramic housing via an overmolding process. Overmolding is an example of an injection molding process.

Some examples of the present disclosure provide that the elastomer may be directly adhered, e.g., so that the elastomer is in direct contact with the surface of the ceramic housing, to the surface of the ceramic housing. However, examples of the present disclosure are not so limited. For instance, some examples of the present disclosure provide that the elastomer may be indirectly adhered, e.g., so that the elastomer is in not direct contact with the surface of the ceramic housing, to the surface of the ceramic housing. As an example, an interface, such as an adhesive among others, may be utilized. Some examples of the present disclosure provide the interface may be located between the elastomer and the surface of the ceramic housing.

At 344, the method 342 can include forming a deposition layer on the surface of the ceramic housing. As discussed herein, the forming a deposition layer on the surface of the ceramic housing can include ion-beam sputtering, reactive sputtering, ion-assisted deposition, high-target-utilization sputtering, high-power impulse magnetron sputtering, gas flow sputtering, and chemical vapor deposition, among others.

In various examples, the method can include forming a functional coating layer on the surface of the ceramic housing. As mentioned, a functional coating layer can be formed on the surface of the ceramic housing subsequent to the deposition layer being formed on the surface of the ceramic housing.

The specification examples are utilized to provide a description. Since many examples can be made without departing from the spirit and scope of the system and method of the present disclosure, this specification sets forth some of the many possible example configurations and implementations.

In the detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be used and the process, electrical, and/or structural changes may be made without departing from the scope of the present disclosure.

The figures herein follow a numbering convention in which the first digit or digits correspond to the drawing figure number and the remaining digits identify an element or component in the drawing. Elements shown in the various examples herein can be added, exchanged, and/or eliminated so as to provide a number of additional examples of the present disclosure.

In addition, the proportion and the relative scale of the elements provided in the figures are intended to illustrate the examples of the present disclosure, and should not be taken in a limiting sense. As used herein, "a number of" an entity, an element, and/or feature can refer to one or more of such entities, elements, and/or features.

What is claimed:

1. A housing for an electronic device comprising:
    a ceramic surface that houses components of the electronic device; and
    an elastomer, wherein the elastomer has a median thickness from 0.01 millimeters to 1.00 millimeter and covers from ten percent to eighty-five percent of a total surface area of the surface.

2. The housing of claim 1, wherein the elastomer is a thermoset polymer.

3. The housing of claim 1, wherein the elastomer is a thermoplastic polymer.

4. The housing of claim 1, wherein the elastomer is selected from the group consisting of polyisoprene, styrene-butadiene, polybutadiene, acetonitrile-butadiene, isobutylene-isoprene, ethylene-propylene monomer, ethylene-propylene-diene monomer, polychloroprene, thermoplastic urethane elastomers, styrenic block copolymers, copolyether ester elastomers, polyester amide elastomers, alkyl acrylate copolymer, chlorinated polyethylene, epichlorohydrin, fluoropolymer, hydrogenated nitrile, polysulphide, nitrile, polyurethane, silicone, tetrafluoroethylene propylene, and combinations thereof.

5. The housing of claim 1, further including a deposition layer formed on the ceramic surface of the housing.

6. A system comprising:
    an electronic device; and
    a ceramic housing including a ceramic surface, wherein the ceramic housing houses components of the electronic device, wherein an elastomer has a median thickness from 0.01 millimeters to 1.00 millimeter and covers from ten percent to eighty-five percent of a total surface area of an exterior surface of the surface.

7. The system of claim 6, wherein the ceramic housing includes a ceramic selected from the group consisting of alumina, zirconia, titanium carbide, silicon carbide, boron nitride, and porcelain.

8. The system of claim 6, wherein the ceramic housing is radio transparent.

9. The system of claim 6, wherein the surface is an exterior surface of the ceramic housing and covers the exterior surface in a non-random arrangement.

10. The system of claim 6, wherein the surface is an exterior surface of the ceramic housing and covers the exterior surface in a random arrangement.

11. The system of claim 6, wherein the surface is an exterior surface of the ceramic housing and covers the exterior surface in a combination of a non-random arrangement and a random arrangement.

12. A method for forming a ceramic housing for an electronic device comprising:
    adhering an elastomer to a surface of the ceramic housing that houses components of the electronic device, wherein the elastomer has a median thickness from 0.01 millimeters to 1.00 millimeter and covers from ten percent to eighty-five percent of a total surface area of the surface; and
    forming a deposition layer on the surface of the ceramic housing.

13. The method of claim 12, wherein forming the deposition layer on the surface of the ceramic housing includes utilizing a physical vapor deposition process selected from the group consisting of ion-beam sputtering, reactive sputtering, ion-assisted deposition, high-target-utilization sputtering, high-power impulse magnetron sputtering, gas flow sputtering, and chemical vapor deposition.

14. The substrate of claim 13, including forming a functional coating layer on the surface of the ceramic housing subsequent to formation of the deposition layer.

15. A housing for an electronic device comprising:
    a ceramic surface that houses components of the electronic device; and
    an elastomer, wherein the elastomer covers from ten percent to eighty-five percent of a total surface area of the surface, and wherein the elastomer is selected from the group consisting of polyisoprene, styrene-butadiene, polybutadiene, acetonitrile-butadiene, isobutylene-isoprene, ethylene-propylene monomer, ethylene-propylene-diene monomer, polychloroprene, thermoplastic urethane elastomers, styrenic block copolymers, copolyether ester elastomers, polyester amide elastomers, alkyl acrylate copolymer, chlorinated polyethylene, epichlorohydrin, fluoropolymer, hydrogenated nitrile, polysulphide, nitrile, polyurethane, silicone, tetrafluoroethylene propylene, and combinations thereof.

16. The housing of claim 15, wherein the elastomer is a thermoset polymer.

17. The housing of claim 15, wherein the elastomer is a thermoplastic polymer.

18. The housing of claim 15, further including a deposition layer formed on the ceramic surface of the housing.

19. A system comprising:
    an electronic device; and a ceramic housing including a ceramic surface, wherein the ceramic housing houses components of the electronic device, wherein an elastomer covers from ten percent to eighty-five percent of a total surface area of an exterior surface of the surface, and wherein the elastomer is selected from the group consisting of polyisoprene, styrene-butadiene, polybutadiene, acetonitrile-butadiene, isobutylene-isoprene, ethylene-propylene monomer, ethylene-propylene-diene monomer, polychloroprene, thermoplastic urethane elastomers, styrenic block copolymers, copolyether ester elastomers, polyester amide elastomers, alkyl acrylate copolymer, chlorinated polyethylene, epichlorohydrin, fluoropolymer, hydrogenated nitrile, polysulphide, nitrile, polyurethane, silicone, tetrafluoroethylene propylene, and combinations thereof.

20. The system of claim 19, wherein the ceramic housing includes a ceramic selected from the group consisting of alumina, zirconia, titanium carbide, silicon carbide, boron nitride, and porcelain.

21. The system of claim 19, wherein the ceramic housing is radio transparent.

22. The system of claim 19, wherein the surface is an exterior surface of the ceramic housing and covers the exterior surface in a non-random arrangement.

23. The system of claim 19, wherein the surface is an exterior surface of the ceramic housing and covers the exterior surface in a random arrangement.

24. The system of claim 19, wherein the surface is an exterior surface of the ceramic housing and covers the exterior surface in a combination of a non-random arrangement and a random arrangement.

25. A method for forming a ceramic housing for an electronic device comprising:

adhering an elastomer to a surface of the ceramic housing that houses components of the electronic device, wherein the elastomer covers from ten percent to eighty-five percent of a total surface area of the surface, and wherein the elastomer is selected from the group consisting of polyisoprene, styrene-butadiene, polybutadiene, acetonitrile-butadiene, isobutylene-isoprene, ethylene-propylene monomer, ethylene-propylene-diene monomer, polychloroprene, thermoplastic urethane elastomers, styrenic block copolymers, copolyether ester elastomers, polyester amide elastomers, alkyl acrylate copolymer, chlorinated polyethylene, epichlorohydrin, fluoropolymer, hydrogenated nitrile, polysulphide, nitrile, polyurethane, silicone, tetrafluoroethylene propylene, and combinations thereof; and forming a deposition layer on the surface of the ceramic housing.

26. The method of claim 25, wherein forming the deposition layer on the surface of the ceramic housing includes utilizing a physical vapor deposition process selected from the group consisting of ion-beam sputtering, reactive sputtering, ion-assisted deposition, high-target-utilization sputtering, high-power impulse magnetron sputtering, gas flow sputtering, and chemical vapor deposition.

27. The substrate of claim 26, including forming a functional coating layer on the surface of the ceramic housing subsequent to formation of the deposition layer.

* * * * *